United States Patent
Hung et al.

(10) Patent No.: US 6,741,474 B1
(45) Date of Patent: May 25, 2004

(54) ELECTRICAL DEVICE WITH A REVOLVABLE DISPLAY PANEL

(75) Inventors: Po-Wen Hung, Taipei Hsien (TW); Te-Ming Hsu, Taipei Hsien (TW)

(73) Assignee: Micro-Star Int'l Co., Ltd., Chung-Ho (TW)

( * ) Notice: Subject to any disclaimer, the term of this patent is extended or adjusted under 35 U.S.C. 154(b) by 0 days.

(21) Appl. No.: 10/250,265

(22) Filed: Jun. 18, 2003

(30) Foreign Application Priority Data

Jan. 30, 2003 (TW) ........................................ 092201947

(51) Int. Cl.⁷ .................................................. H05K 5/00

(52) U.S. Cl. ........................ 361/727; 361/784; 361/801; 292/87; 312/223.6

(58) Field of Search ................................. 361/727–729, 361/732, 740, 747, 750, 759, 784, 789, 798, 801, 683–687; 211/41.17; 312/223.1–223.6; 364/708.1; 360/47.01, 137; 292/87

(56) References Cited

U.S. PATENT DOCUMENTS

| | | | | |
|---|---|---|---|---|
| 6,297,962 B1 | * | 10/2001 | Johnson et al. | 361/726 |
| 6,373,695 B1 | * | 4/2002 | Cheng | 361/685 |
| 2003/0039099 A1 | * | 2/2003 | Chen | 361/727 |

\* cited by examiner

*Primary Examiner*—Hung Van Duong
(74) *Attorney, Agent, or Firm*—Winston Hsu

(57) ABSTRACT

An electrical device with a revolvable display panel. The electrical device comprises a housing, a guidance means, a sliding means, and a revolving means. The housing has a plurality of housing walls. One of the housing walls contains an opening. The guidance means is set inside the housing close to the opening. The sliding means is guided by the guidance means to slide into an inside position and an outside position of the housing. The revolving means has a display panel and is pivotally connected to the sliding means. When the sliding means is in the inside position, the sliding means with the display panel of the revolving means is situated inside the housing. When the sliding means slides into the outside position, the sliding means with the display panel is situated outside of the housing, thus the display panel can revolve to change an angle of the display panel.

12 Claims, 10 Drawing Sheets

ELECTRICAL DEVICE WITH A REVOLVABLE DISPLAY PANEL

BACKGROUND OF INVENTION

1. Field of the Invention

The invention relates to an electrical device, and more particularly, to an electrical device with a revolvable display panel, which can be hidden in the electrical device.

2. Description of the Prior Art

FIG. 1 is an industrial computer 8 according to the prior art. The industrial computer 8 is piled up substantially by a plurality of rack mountable servers 81 which have flat and cuboid shapes, such as 1U servers. Each server contains a liquid crystal display (LCD) panel 812 on its front panel 811 for shoving its operation state. However, the display panel 812 takes up too much area of the front panel 811 so that less switches and elements can be set on the front panel 811. Besides that, the location of the display panel 812 is fixed and cannot be changed according to the viewing angle of a user. Therefore an improved design is produced, as shown in FIG. 2.

FIG. 2 is a server 91 with a display panel 912 located on a slab 911 which can revolve horizontally with respect to the server 91 according to the prior art. The display panel 912 can be revolved according to the viewing angle or location of the user. However, the slab 911 protrudes from the front panel 913 of the server 91, so that the space arrangement is limited for other equipments or devices. Furthermore, for the inner electric elements in the display panel 812 or in the display panel 912, both have to be set with a specific mechanism of the server 81 and 91, and that makes the server 81 and 91 have more application limitations.

SUMMARY OF INVENTION

It is therefore an objective of the claimed invention to provide an electrical device with a revolvable display panel having the lowest affect on the space arrangement of each element of the electrical device.

According to the claimed invention, the electrical device with a revolvable display panel comprises a housing, a guidance means, a sliding means, and a revolving means. The housing has a plurality of housing walls to define a receiving space forsetting a plurality of electric elements, wherein one of the housing walls contains an opening. The guidance means is set inside the housing close to the opening. The sliding means is guided by the guidance means to slide into an inside position and into an outside position of the housing. The revolving means has a display panel thereon and is pivotally connected to the sliding means for being revolvable with respect to the sliding means.

Depending on the design of the claimed invention, when the sliding means is situated in the inside position, the sliding means together with the display panel of the revolving means is situated inside the housing, and when the sliding means slides into the outside position through the opening, an external portion of the sliding means together with the display panel is situated outside of the housing so that the display panel can revolve to the sliding means to change an angle of the display panel.

Furthermore, the element device can further comprise a spring clutch means set inside the housing close to an internal portion of the guidance means. The spring clutch means comprises a springing portion and a clutch portion actuated to the springing portion. When a portion of the sliding means corresponding to the spring clutch portion presses the springing portion, the clutch portion will catch the sliding means in the inside position, and when the portion of the sliding means corresponding to the spring clutch means presses the springing portion once again, the clutch portion will release the sliding means and actuate the springing portion to provide a springing force toward out of the housing to the sliding means so that the sliding means will slide into the outside position.

These and other objectives of the claimed invention will no doubt become obvious to those of ordinary skill in the art after reading the following detailed description of the preferred embodiment, which is illustrated in the various figures and drawings.

DETAILED DESCRIPTION

The above-mentioned and other technical contents, characteristics, and functionalities of the present invention will be detailed described below through a preferred embodiment with referring to attached figures.

Figure 1:
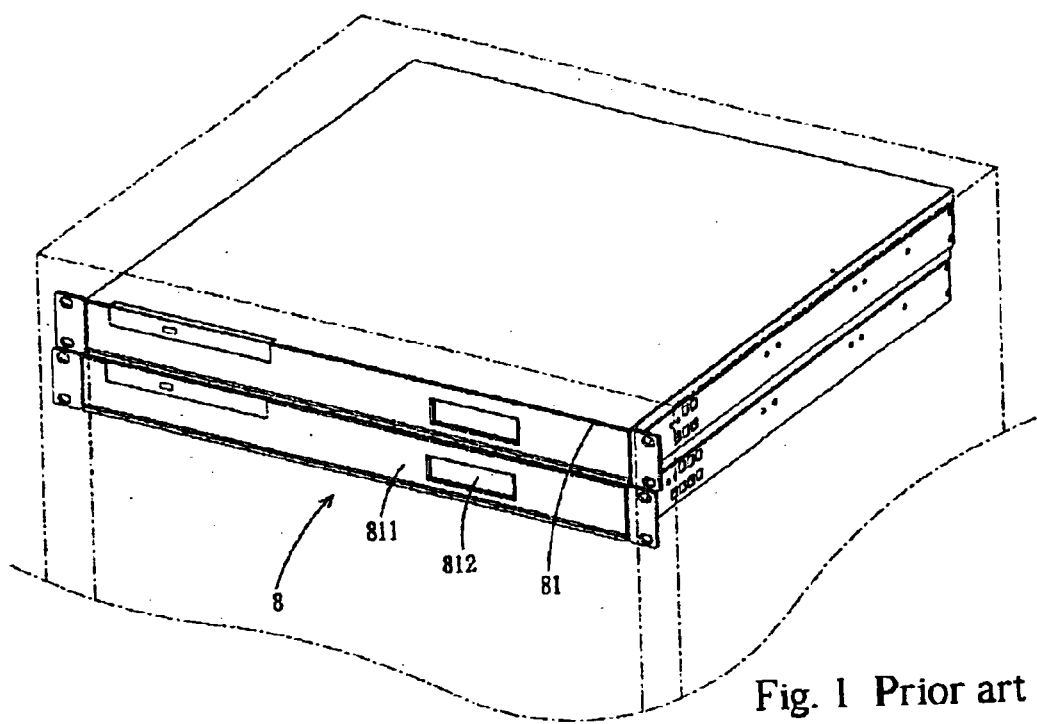
FIG. 1 is a diagram of an industrial computer according to the prior art.
Figure 2:
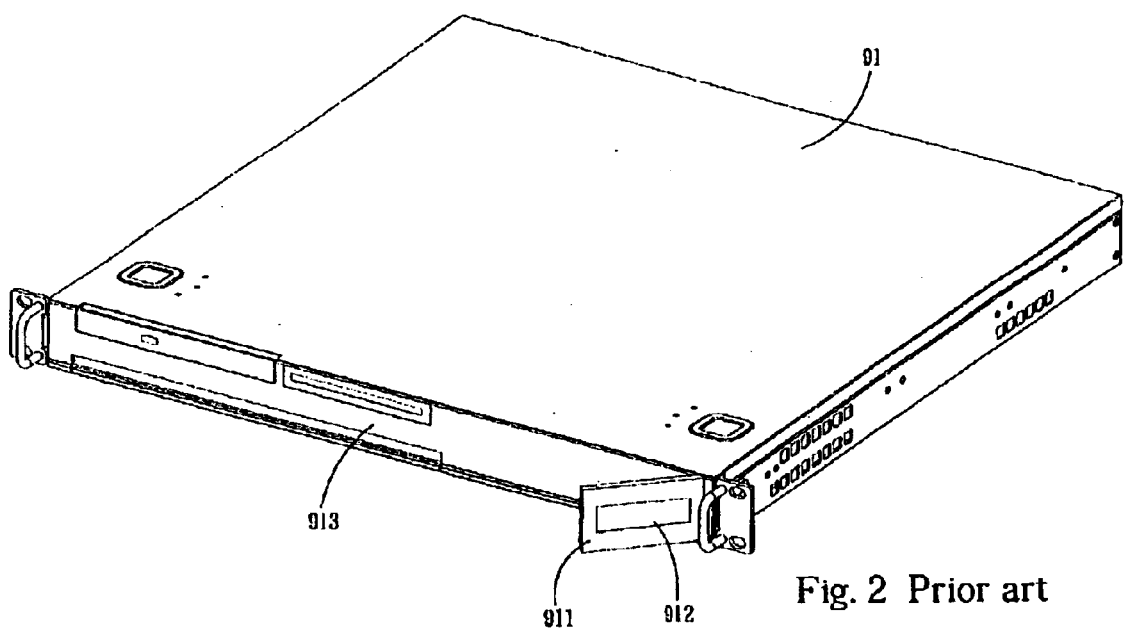
FIG. 2 is a diagram of a server with a display panel located on a slab which can revolve horizontally with respect to a server according to the prior art.
Figure 3:
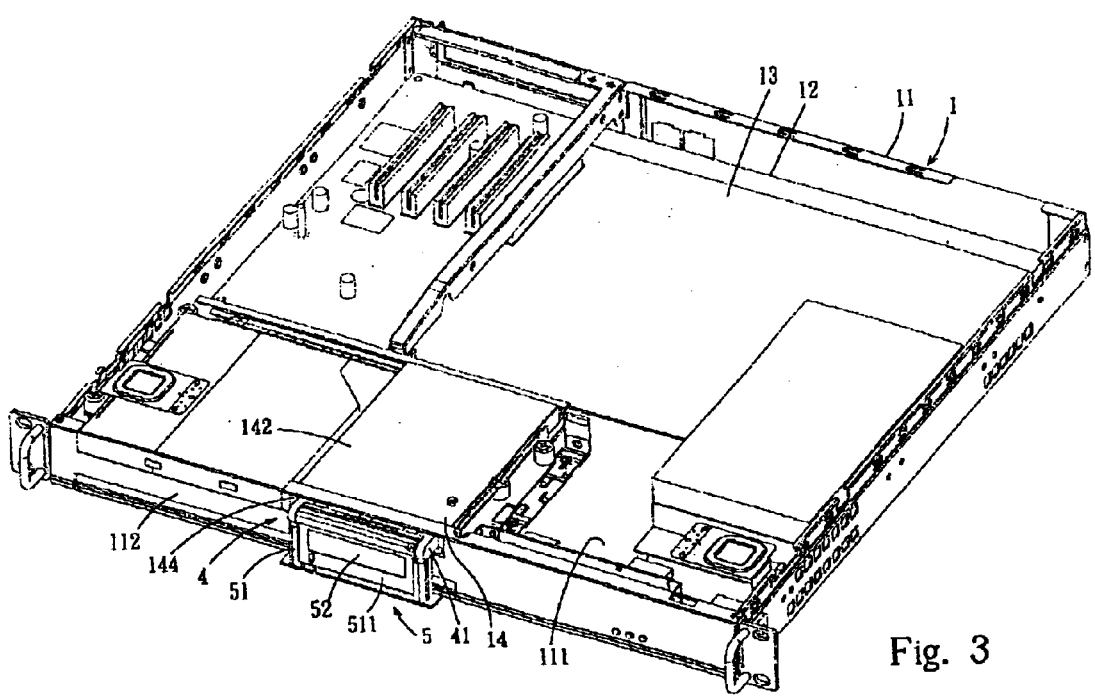
FIG. 3 is a diagram of an electrical device according to a preferred embodiment of the present invention.
Figure 4:
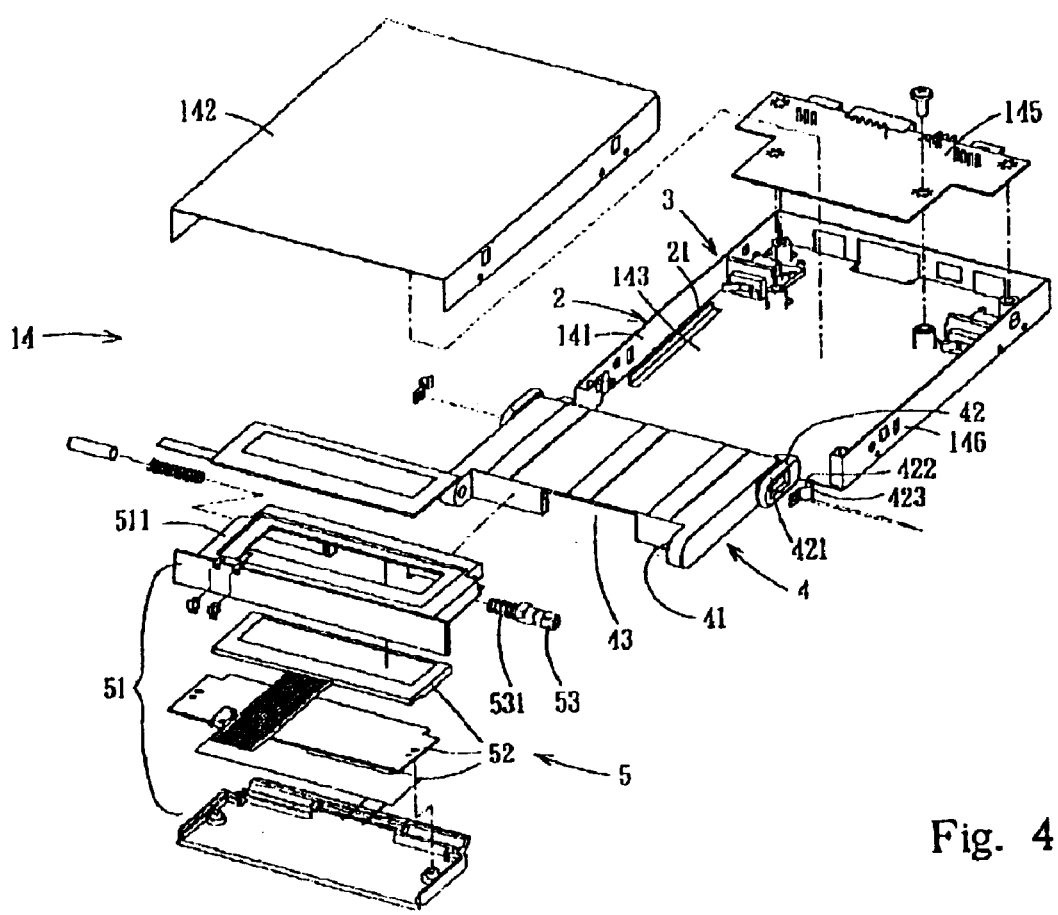
FIG. 4 is an exploded view of a portion of means of the electrical device shown in FIG. 3.

As shown in FIG. 3 and FIG. 4, the electrical device with a revolvable display panel according to the preferred embodiment of the present invention comprises a housing 1, a guidance means 2, a spring clutch means 3, a sliding means 4, and a revolving means 5. The electrical device of the preferred embodiment is a rack mountable server (1U server) set on an industrial computer. However, it is also applicable to any other information, communication, and electrical products.

The housing 1 has a plurality of housing walls 11 and has a flat and cuboid shape. The housing walls together define a receiving space 12 with an opening upper side for setting a plurality of electric elements 13 providing operations of the electrical device. One of the housing walls is a bottom housing wall 111. On the proximal side of the bottom housing wall 111 contains a square receiving set 14 comprising a plurality of receiving set-walls 141, which are protruding from the bottom housing wall 111, and a set top 142 covering the set walls 141 to define a receiving container 143. A proximal housing wall 112 has a rectangular opening 144 corresponding to a proximal side of the receiving container 143 so that elements can pass in and out the receiving container 143. The guidance 2 and the spring clutch means 3 are twinned set inside the receiving container 143 on the upper surface of the bottom housing wall 111. In this preferred embodiment, the two guidance means 2 are set on the left and right set walls 141 next to a distal side, each of which is a guidance track expanding along the proximal to distal axial. And each of the spring clutch means 3 is set on the distal side of the guidance means 2 at a predetermined distance.

The sliding means 4 has a rectangular figure, which contains a pair of pivotal-connected portions 41 protruding from the left-proximal side and right-proximal side of the sliding means 4. The pivotal-connected portions 41 have a functionality to provide the revolving means to pivotally connect to the sliding means 4. A pair of sliding sets 42 is set on the left-distal side and right-distal side of the sliding means 4 respectively for sliding on the guidance tracks 21. Therefore the sliding means 4 is guided by the guidance tracks 21 to slide between an inside position and an outside position of the housing 1 through the opening 144. A fillister 421 is on the outside of each of the sliding set 42 for setting a provisional position member 422 to provisionally position the sliding means 4 in the inside position and in the outside position. In the present embodiment, each of the provisional position members 422 is a metal resilient slice with a curving figure. However, any other equal elements can be used as the provisional position members 422.

The revolving means 5 comprises a shell 51 with a flat and cuboid shape, a liquid crystal display panel 52 set inside the shell 51, and a pair of pivots 53 for pivotally connecting the revolving means 5 to pivotal-connected portions 41 on the proximal side of the sliding means 4. As shown in FIG. 4, the display panel 52 is set on a display side 511 on the upper side of the shell 51. And the display panel 52 is connected to a circuit board 145 in the receiving container 143 by a flexible circuit board (not shown) through a hole on the proximal side of the sliding means 4 for transmitting electrical signals. In this embodiment, the pivots 53 enable the revolving means 5, as well as the display panel 52, to be revolvable to any revolving angles with respect to the sliding means 4. The pivots 53 also can provisionally position the revolving means through twist springs 531 and corresponding elements so that the display panel 52 can be provisionally positioned without swinging. The pivots 53 are well-know elements, thus no detailed description will be provided.

Figure 5:
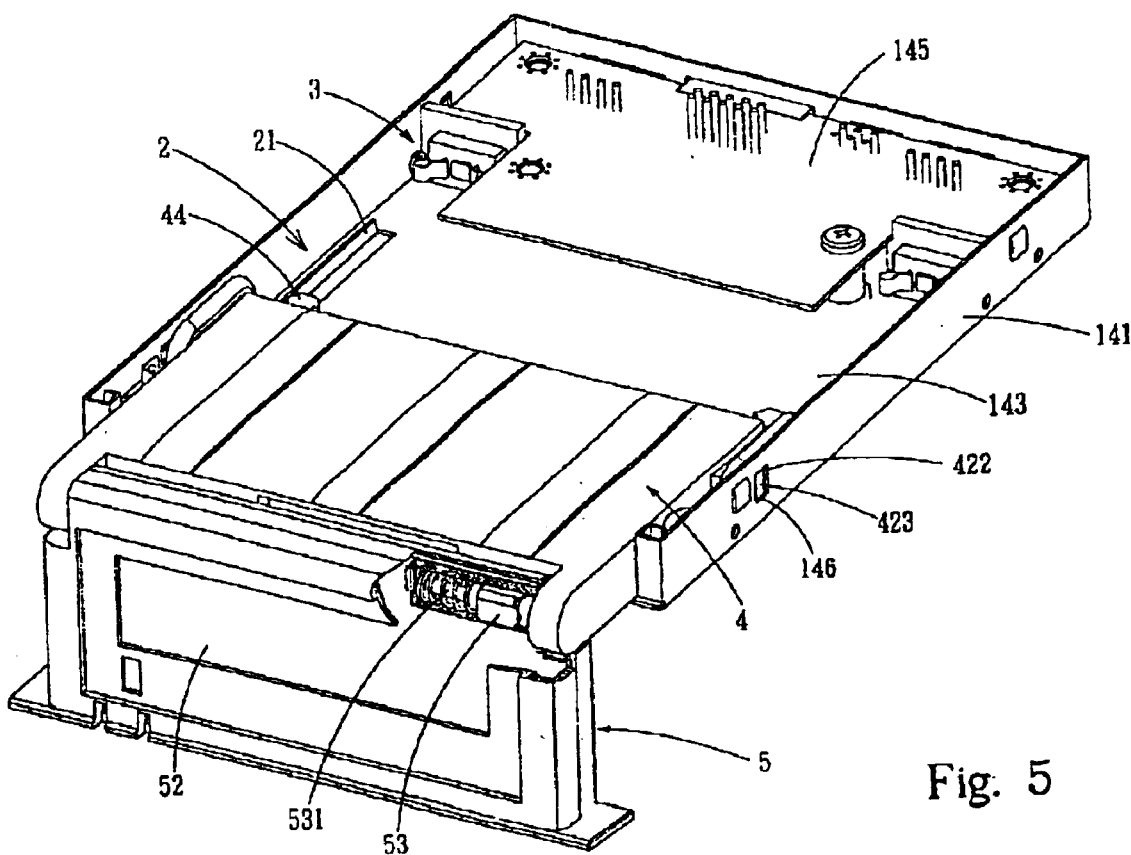
FIG. 5 is an assembled diagram of the means shown in FIG. 4, wherein one of the set tops is not shown for description.

Referring to FIG. 3 and FIGS. 5–9, the sliding means 4 is positioned in the outside position (as shown in FIGS. 3 and 5) during surveying mode. For provisionally positioning the sliding means 4, a curved surface 423 of each of the provisional position members (resilient slices) 422 is lodged in a lodging hole 146 on the proximal side of the set-walls 141. At this station, the revolving means 5 is revolvable with respect to the sliding means 4 to adjust the display panel 52 to a best revolving angle satisfying a relative height and a viewing angle of a user. At the best revolving angle, the revolving means 5 can be provisionally positioned by the pivot 53.

Figure 6:
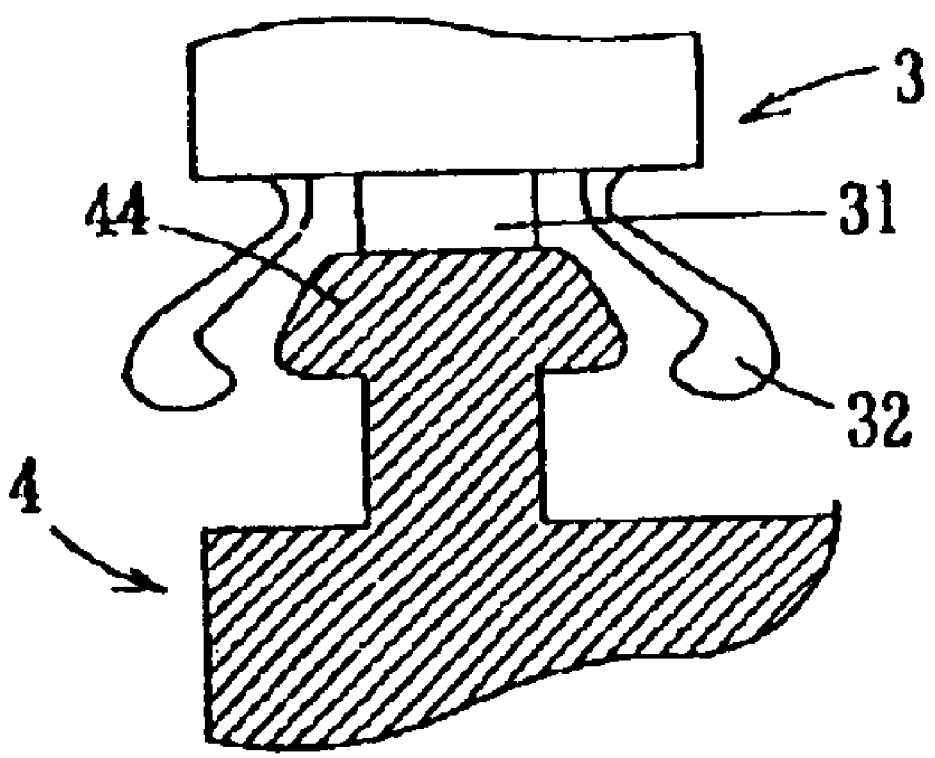
FIG. 6 to FIG. 8 are top views of the operation of a portion of the means shown in FIG. 4 for explaining the functionality of a spring clutch means.
Figure 7:
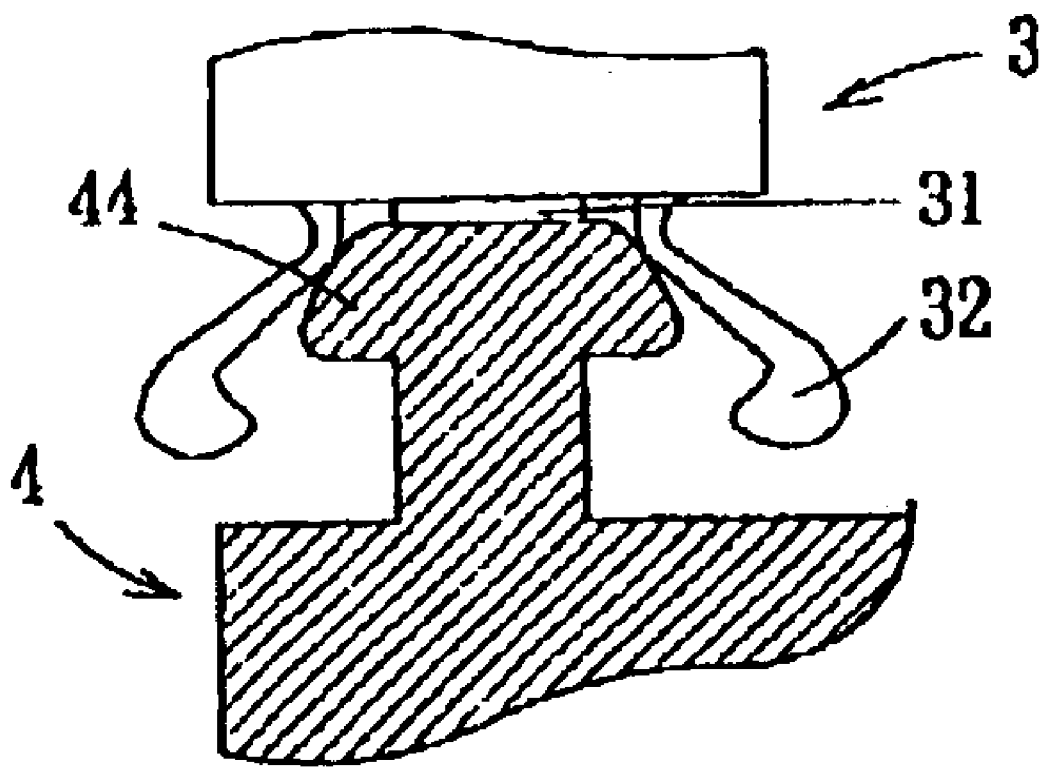
Figure 8:
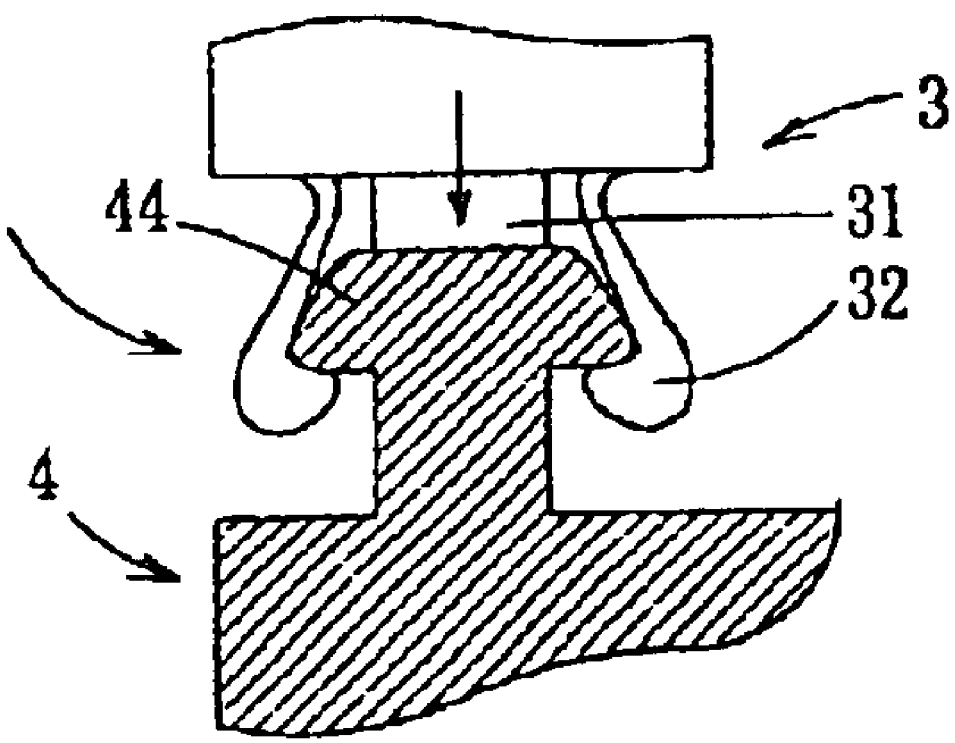
Figure 9:
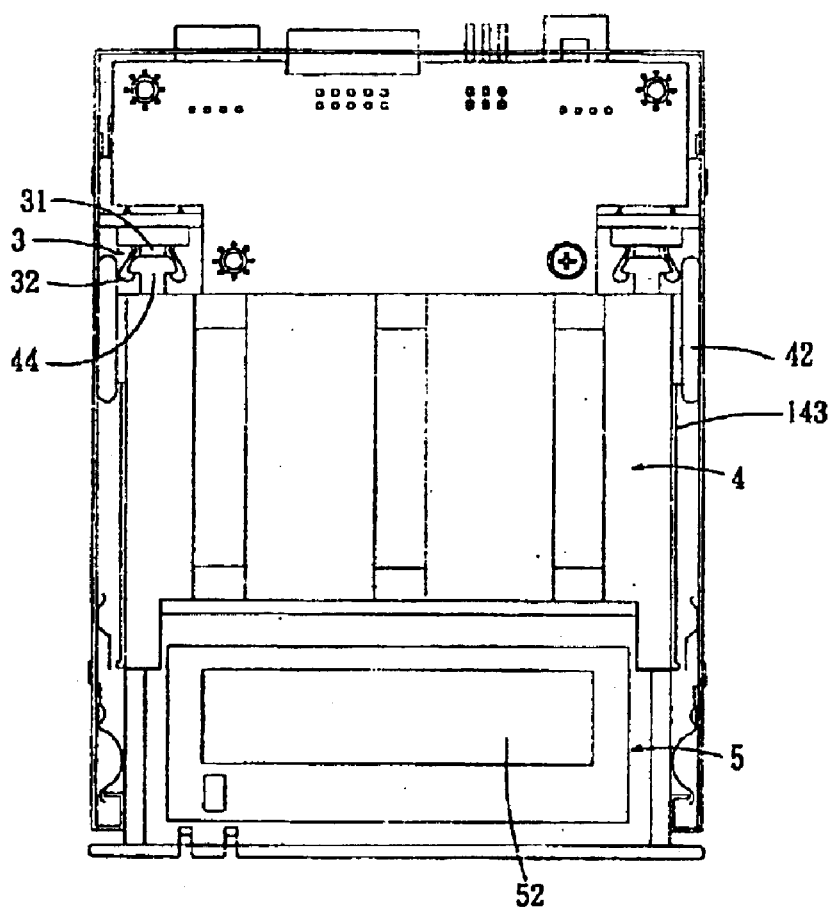
FIG. 9 is a top view of a sliding means in an inside position shown in FIG. 5.
Figure 10:
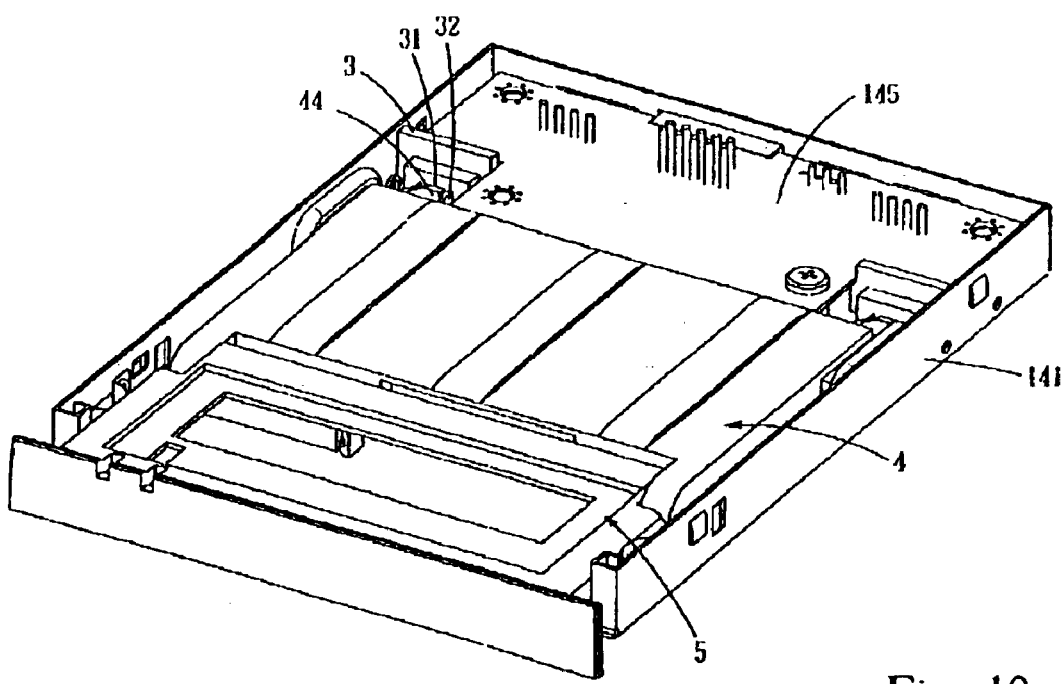
FIG. 10 is an assembled diagram of the means shown in FIG. 4, wherein the sliding means is in an inside position.

When the user does not need to survey the display panel 52, he can push the sliding 5 together with the sliding means 4 into the receiving container 43 until each of the lock pieces 44 on the left distal side and right distal side of the sliding means 4 press a flat springing portion 31, as shown in FIG. 6. Referring to FIG. 7, under the press of the lock piece 44, the springing portion 31 moves back to press a spring (not shown) of the spring clutch means 3 for storing a reposition springing force.

After the user releases the revolving means 5 and the sliding means 4, the reposition springing force presses the lock piece 44 back to move forth. And at the same time, a clutch portion 32 of the spring clutch means is actuated by the springing portion 31 to catch the lock piece 44 to position the sliding means 4 in an inside position shown in FIG. 8 and FIG. 9.

When the user pushes the revolving means 5 with the sliding means 4 once again, the springing portion 31 is pressed by the lock piece 44 to store a reposition springing force, and actuates the clutch portion 32 to open (as shown in FIG. 6) to release the clock piece 44. Then the slicing means 4 and the revolving means 5 are pushed by the reposition springing force of the springing portion 31 to move forth until the provisional position member 422 is lodged in the lodging hole 146 of the set-walls 141. Therefore the sliding means 4 is provisionally positioned in the outside position as shown in FIG. 5. The spring clutch means 3 is a well-known device, thus detailed description of its inner design will not be provided herein.

To summarize the above description, the present invention provides an electrical device with a revolvable display panel. The display panel cannot only be revolved to an expected angle according to the view height, position, and angle of a user, but also can be hidden inside the electrical device to save the operation space. In the preferred embodiment, the receiving container 143 for receiving the sliding means 4 and the revolving means 5 are set in a location for a slim floppy, which is the most seldom used place of the rack mountable server. As a result, the affect on the arrangement and the utility of the electric elements in the server is lowest. Therefore the reform cost of the server for arranging the sliding means 4 and the revolving means 5 can be reduced eminently.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrical device with a revolvable display panel, the electrical device comprising:

a housing having a plurality of housing walls to define a receiving space for setting a plurality of electric elements, one of the housing walls containing an opening;

a guidance means set inside the housing close to the opening;

a sliding means capable of being guided by the guidance means to slide into an inside position and into an outside position of the housing; and a revolving means pivotally connected to the sliding means, the revolving means being revolvable with respect to the sliding means and comprising a display panel;

wherein when the sliding means is in the inside position, the sliding means together with the display panel of the revolving means is situated inside the housing, and when the sliding means slides into the outside position through the opening, an external portion of the sliding means together with the display panel is situated outside of the housing so that the display panel is capable of revolving with respect to the sliding means to change an angle of the display panel.

2. The electrical device of claim 1, wherein the electrical device is a rack mountable server of an industrial computer.

3. The electrical device of claim 1, wherein the guidance means comprises a pair of guidance tracks.

4. The electrical device of claim 1, wherein the revolving means further comprises a pivot for pivotally connecting the revolving means to the external portion of the sliding means, the pivot being capable of provisionally positioning the revolving means in any revolving angles.

5. The electrical device of claim 1, wherein the sliding means further comprises a provisional position member, the provisional position member being capable of provisionally positioning the sliding means in the inside position and in the outside position.

6. The electrical device of claim 1 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

7. The electrical device of claim 2 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

8. The electrical device of claim 3 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

9. The electrical device of claim 4 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

10. The electrical device of claim 5, wherein the provisional position member is a resilient slice located on a side of the sliding means.

11. The electrical device of claim 5 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

12. The electrical device of claim 10 further comprising an spring clutch means set inside the housing close to a internal portion of the guidance means, the spring clutch means comprising:

a springing portion; and a clutch portion actuated to the springing portion;

wherein when a portion of the sliding means corresponding to the spring clutch means presses the springing portion, the clutch portion catches the sliding means in the inside position, and when the portion of the sliding means corresponding to the spring clutch means presses the springing portion once again, the clutch portion releases the sliding means and actuates the springing portion to provide a springing force toward out of the housing to the sliding means so that the sliding means slides into the outside position.

* * * * *